United States Patent
Gotcher, Jr.

(10) Patent No.: US 6,168,504 B1
(45) Date of Patent: Jan. 2, 2001

(54) POLISHING CHUCKS, SEMICONDUCTOR WAFER POLISHING CHUCKS, ABRADING METHODS, POLISHING METHODS, SEMICONDUCTOR WAFER POLISHING METHODS, AND METHODS OF FORMING POLISHING CHUCKS

(75) Inventor: Leland F. Gotcher, Jr., Boise, ID (US)

(73) Assignee: Micron Technology, Inc., Boise, ID (US)

( * ) Notice: Under 35 U.S.C. 154(b), the term of this patent shall be extended for 0 days.

(21) Appl. No.: 09/401,361

(22) Filed: Sep. 21, 1999

Related U.S. Application Data

(62) Division of application No. 09/145,489, filed on Sep. 1, 1998.

(51) Int. Cl.[7] .................................................. B24B 7/22
(52) U.S. Cl. ............................................. 451/41; 451/286
(58) Field of Search .................................. 451/286–290, 451/388, 394, 41

(56) References Cited

U.S. PATENT DOCUMENTS

| | | | |
|---|---|---|---|
| 3,977,130 | * 8/1976 | Degner | 451/397 X |
| 4,918,869 | * 4/1990 | Kitta | 451/288 |
| 5,036,630 | 8/1991 | Kaanta et al. . | |
| 5,095,661 | 3/1992 | Gill, Jr. et al. . | |
| 5,400,547 | 3/1995 | Tanaka et al. . | |
| 5,441,444 | * 8/1995 | Nakajima | 451/288 X |
| 5,486,129 | 1/1996 | Sandhu et al. . | |
| 5,532,903 | 7/1996 | Kendall . | |
| 5,584,746 | 12/1996 | Tanaka et al. . | |
| 5,584,751 | * 12/1996 | Kobayashi et al. | 451/288 |
| 5,588,902 | 12/1996 | Tominaga et al. . | |
| 5,624,299 | 4/1997 | Shendon . | |
| 5,645,474 | 7/1997 | Kubo et al. . | |
| 5,724,121 | 3/1998 | McKinley et al. . | |
| 5,769,697 | 6/1998 | Nishio . | |
| 5,816,900 | 10/1998 | Nagahara et al. . | |
| 5,931,725 | 8/1999 | Inaba et al. . | |
| 5,938,884 | 8/1999 | Hoshizaki et al. . | |

\* cited by examiner

*Primary Examiner*—David A. Scherbel
*Assistant Examiner*—Anthony Ojini
(74) *Attorney, Agent, or Firm*—Wells, St. John, Roberts, Gregory & Matkin P.S.

(57) ABSTRACT

Polishing chucks, semiconductor wafer polishing chucks, abrading methods, polishing methods, semiconductor wafer polishing methods, and methods of forming polishing chucks are described. In one embodiment, a polishing chuck includes a body dimensioned to hold a work piece, and a multi-positionable, force-bearing engagement surface is positioned on the body to engage at least a portion of a work piece held thereby. The surface has an undeflected position, and is bi-directionally deflectable away from the undeflected position. In another embodiment, a yieldable engagement surface is provided on the body and has a central area and a peripheral area outward of the central area. One of the central and peripheral areas is movable, relative to the other of the areas to provide both inwardly and outwardly flexed surface configurations. In yet another embodiment, a generally planar surface is provided on the body and positioned to receive the work piece thereagainst. The surface is movable into a non-planar, force-varying configuration in which more force is exerted on outermost portions of a work piece during polishing than on innermost portions of a work piece. A deflector is operably connected with the surface and configured to move the surface into the non-planar configuration. In a preferred embodiment, a force-varying deflector on the body is configured and operable to move the body surface into both concave and convex force-varying configurations.

25 Claims, 6 Drawing Sheets

POLISHING CHUCKS, SEMICONDUCTOR WAFER POLISHING CHUCKS, ABRADING METHODS, POLISHING METHODS, SEMICONDUCTOR WAFER POLISHING METHODS, AND METHODS OF FORMING POLISHING CHUCKS

CROSS REFERENCE TO RELATED APPLICATION

This is a Divisional of U.S. patent application Ser. No. 09/145,489, filed Sep. 1, 1998, and titled "Polishing Chucks, Semiconductor Wafer Polishing Chucks, Abrading Methods, Polishing Methods, Semiconductor Wafer Polishing Methods, and Methods of Forming Polishing Chucks".

TECHNICAL FIELD

This invention relates to polishing chucks, to semiconductor wafer polishing chucks, to abrading methods, to polishing methods, to semiconductor wafer polishing methods, and to methods of forming polishing chucks.

BACKGROUND OF THE INVENTION

Polishing systems can typically include a polishing chuck which holds a work piece, and a platen upon which a polishing pad is mounted. One or more of the chuck and platen can be rotated and brought into physical contact with the other, whereby the work piece or portions thereof are abraded, ground, or otherwise polished. One problem associated with abrading, grinding or polishing work pieces in such systems, concerns uniformly removing or controlling the amount of material being removed from over the surface of a work piece.

Specifically, because of the dynamics involved in abrading work pieces, greater amounts of material can be removed over certain portions of a work piece, while lesser amounts of material are removed over other portions. Such can result in an undesirable abraded, ground, or polished profile. Yet, in other applications, it can be desirable to remove, somewhat unevenly, material from over certain portions of a work piece and not, or to a lesser degree over other portions of a work piece.

This invention arose out of concerns associated with providing improved uniformity in abrading, grinding, and/or polishing scenarios. In particular, this invention arose out of concerns associated with providing uniformity and flexibility in the context of semiconductor wafer processing, wherein such processing includes abrading, grinding, or otherwise polishing a semiconductor wafer or work piece.

SUMMARY OF THE INVENTION

Polishing chucks, semiconductor wafer polishing chucks, abrading methods, polishing methods, semiconductor wafer polishing methods, and methods of forming polishing chucks are described. In one embodiment, a polishing chuck includes a body dimensioned to hold a work piece, and a multi-positionable, force-bearing engagement surface is positioned on the body to engage at least a portion of a work piece held thereby. The surface has an undeflected position, and is bi-directionally deflectable away from the undeflected position. In another embodiment, a yieldable engagement surface is provided on the body and has a central area and a peripheral area outward of the central area. One of the central and peripheral areas is movable, relative to the other of the areas to provide both inwardly and outwardly flexed surface configurations. In yet another embodiment, a generally planar surface is provided on the body and positioned to receive the work piece thereagainst. The surface is movable into a non-planar, force-varying configuration in which more force is exerted on outermost portions of a work piece during polishing than on innermost portions of a work piece. A deflector is operably connected with the surface and configured to move the surface into the non-planar configuration. In a preferred embodiment, a force-varying deflector on the body is configured and operable to move the body surface into both concave and convex force-varying configurations.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
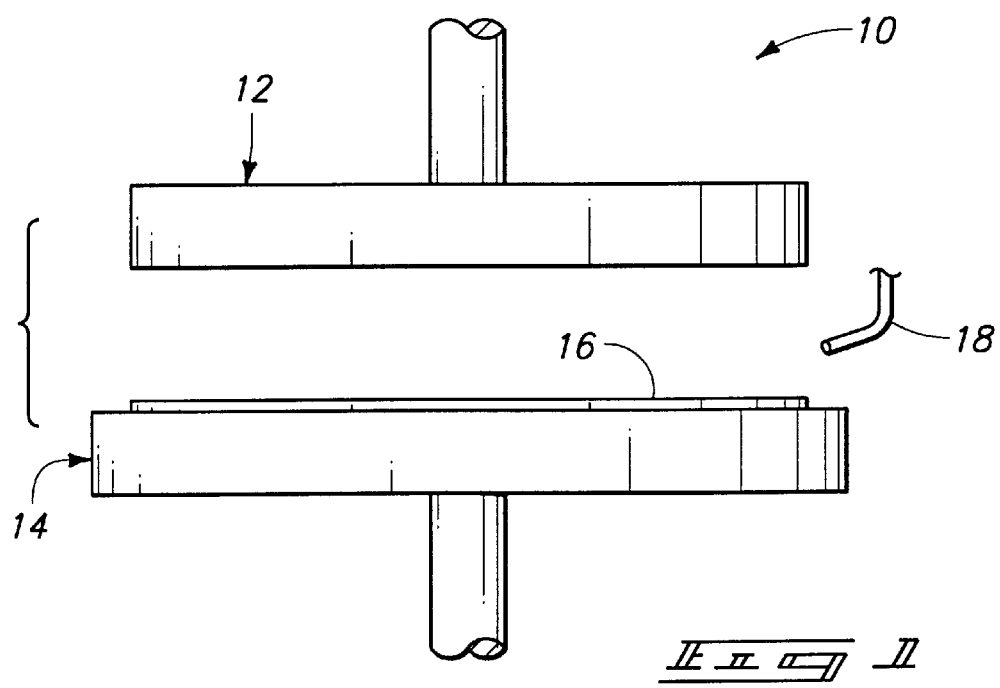
FIG. 1 is a side elevational view of one abrading system which sets forth some basic exemplary elemental features thereof.

Referring to FIG. 1, an abrading system is shown generally at 10 and includes a chuck 12, and a platen 14. A polishing pad 16 is provided and mounted on platen 14. A polishing media source 18 can be provided for delivering a polishing fluid, e.g. polishing slurry, onto polishing pad 16. Abrading system 10 is typically operated by rotating either or both of chuck 12 and platen 14 to effectuate abrading, grinding, or otherwise polishing of a work piece which is retained or held by chuck 12. In a preferred embodiment, abrading system 10 is configured to process semiconductor wafers and, accordingly, is configured as a semiconductor wafer polishing system. Other types of material can, however, be polished utilizing abrading system 10. Such materials include sheets of metal or glass, ceramic discs, or any other type of material which can be polished in accordance with principles of the invention described just below. Particular types of materials with which the invented systems and methods find utility concerns those materials which are flexible to some degree. Such will become more readily apparent as the description below is read.

Figure 2:
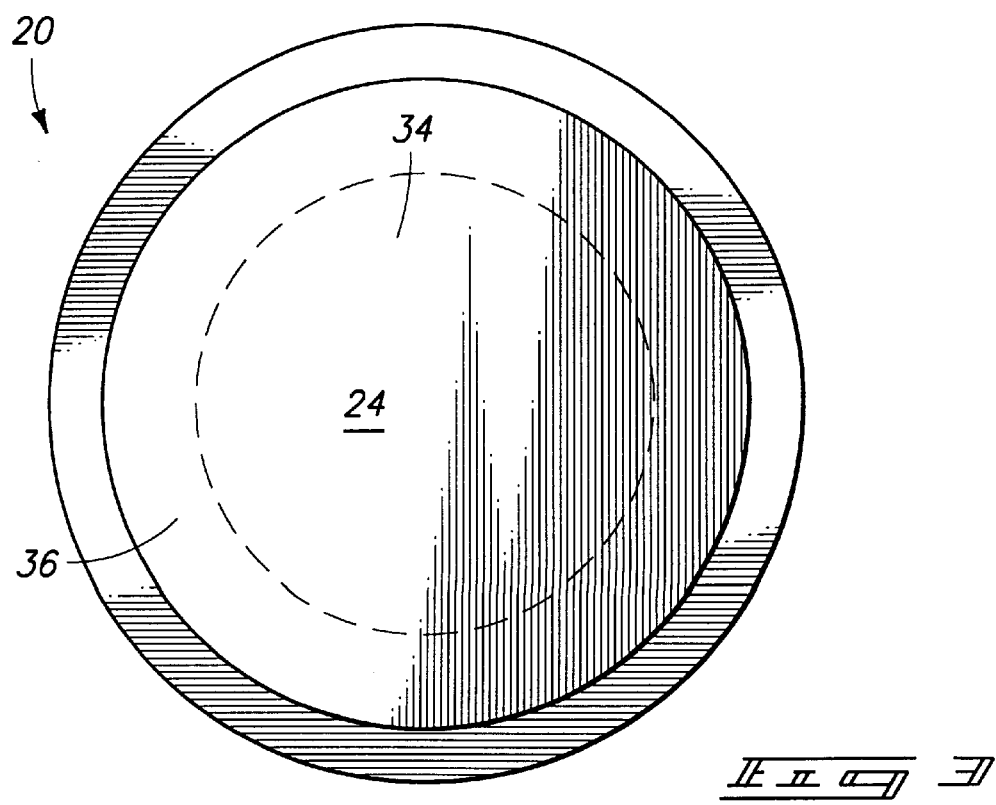
FIG. 2 is an enlarged sectional and fragmentary view of an abrading chuck in accordance with one embodiment of the invention.
Figure 3:
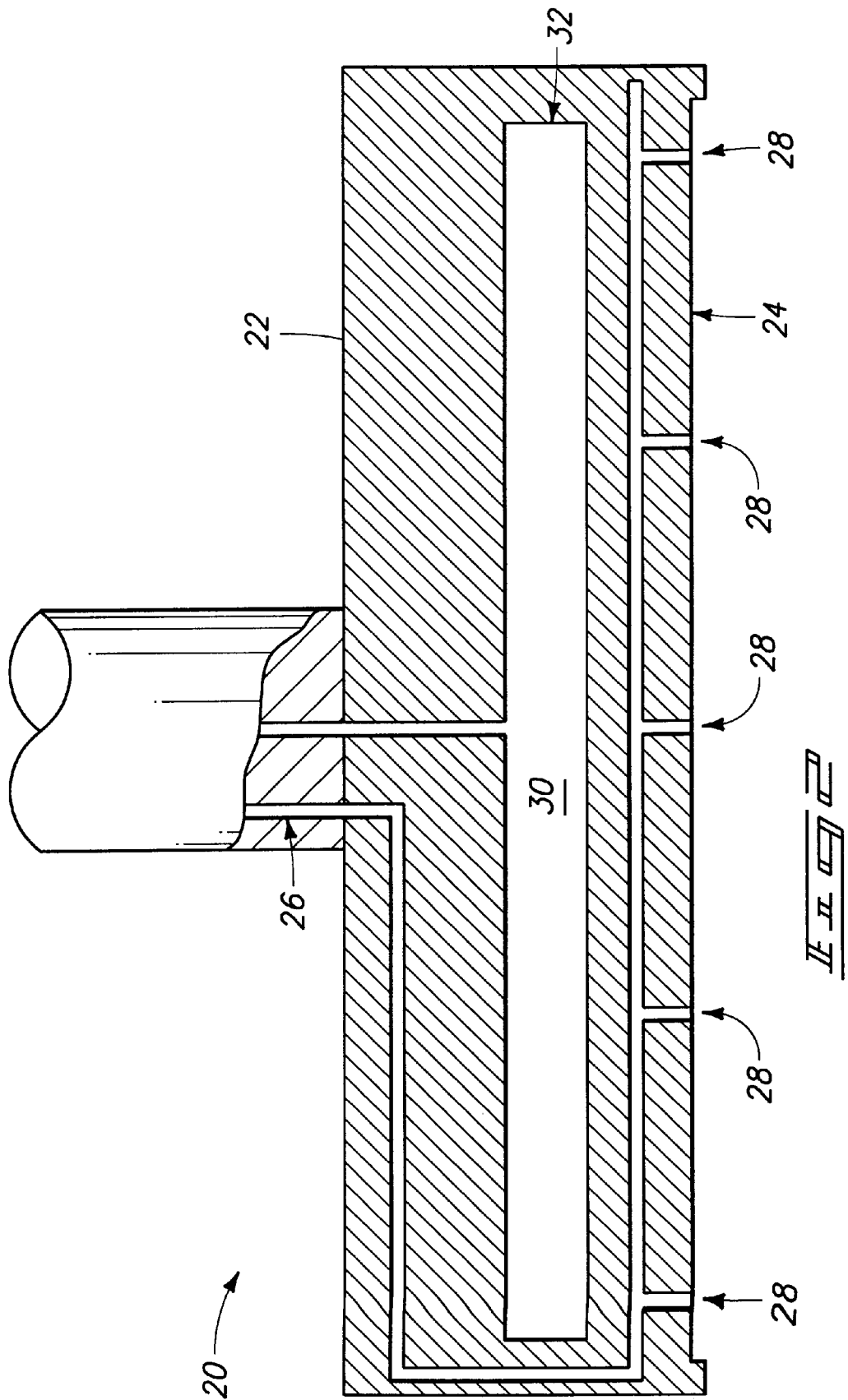
FIG. 3 is a view, from the bottom up, of an underside of a polishing chuck in accordance with one embodiment of the invention.
Figure 4:
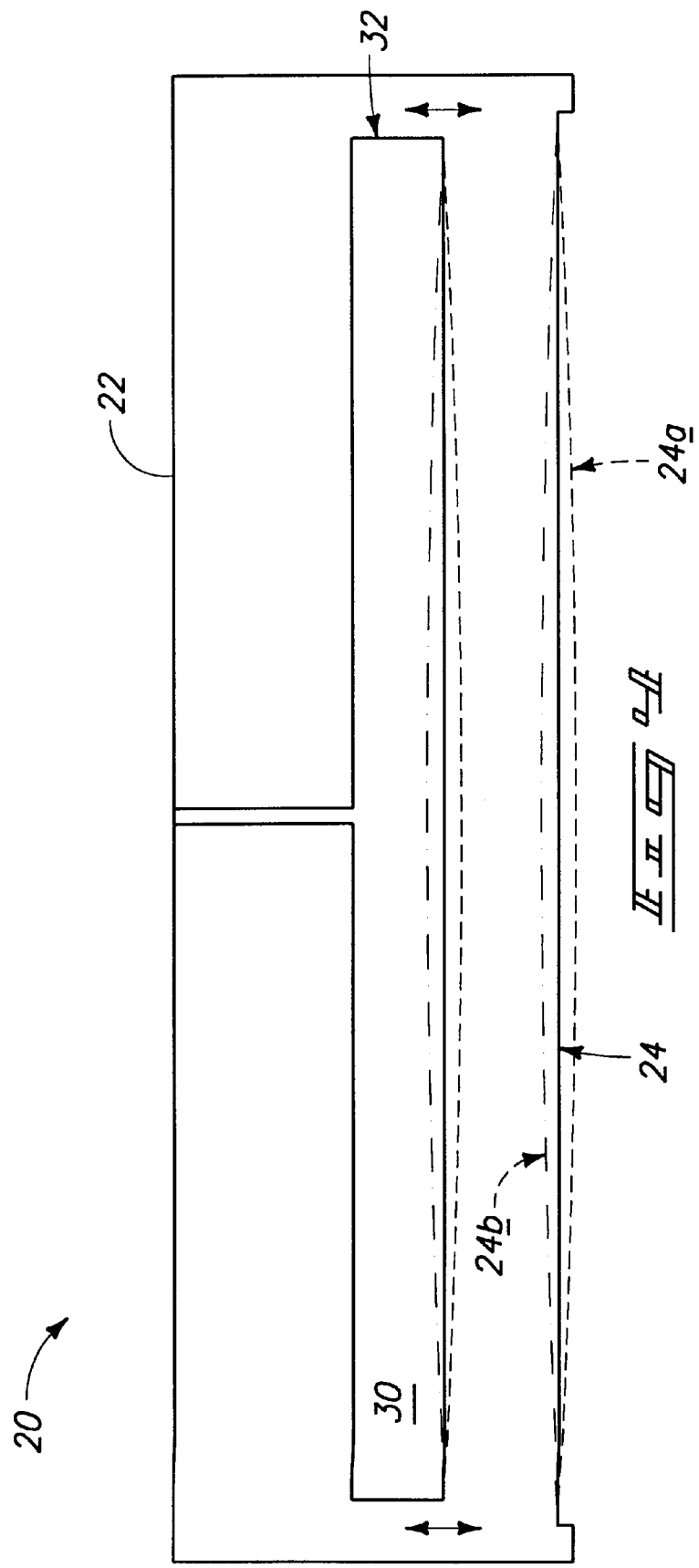
FIG. 4 is a view which is somewhat similar to the FIG. 2 view, but is one which shows certain aspects of the invention in more detail.

Referring to FIGS. 2–4, a chuck is shown generally at 20 and includes a body 22 which is dimensioned to hold a work piece which is to be abraded, ground, or otherwise polished. In a preferred embodiment, body 22 is dimensioned to receive and hold a generally planar semiconductor wafer, e.g. an eight-inch wafer. In one embodiment, chuck 20 is provided with a multi-positionable, force-bearing engagement surface 24 which is positioned on body 22 to engage at least a portion of a work piece held thereby. In the illustrated example, a vacuum conduit 26 (FIG. 2) is provided and includes a plurality of outlets 28 which are used to retain a semiconductor wafer through negative vacuum pressure as will become apparent below.

In one multi-positionable embodiment, engagement surface 24 has an undeflected or neutral position (shown in solid lines in FIG. 4 at 24), and is bi-directionally deflectable away from the undeflected position to different positions, one of which being shown by dashed line 24a, the other of which being shown by dashed line 24b. In a preferred embodiment, deflection of engagement surface 24 takes place in a direction which is generally normally away from the engagement surface when in the undeflected position. For example, FIG. 4 shows engagement surface 24 in an undeflected (solid line) position. A deflected engagement surface is shown at 24a and has been deflected in a first direction which is generally normally away from engagement surface 24 in the undeflected position. The same can be said of the position depicted at 24b, only with movement taking place in the opposite direction. Deflection can take place through a range which is one micron or less away from the undeflected position.

Deflection of engagement surface 24 can be achieved, in but one example, in one or both of the directions, by providing a region 30 proximate engagement surface 24 which is expandable or contractible to displace the engagement surface in a particular direction. Region 30 is preferably selectively placeable into a variety of pressure configurations which act upon and thereby displace the engagement surface sufficiently to deflect the surface in one or more directions away from the undeflected position. In a preferred embodiment, a pressure chamber 32 is provided proximate engagement surface 24 and is configured to develop regions of positive and/or negative pressure sufficient to deflect engagement surface 24. Pressure can be controlled through the use of gases or fluids, and can be mechanically or electronically regulated.

Figure 5:
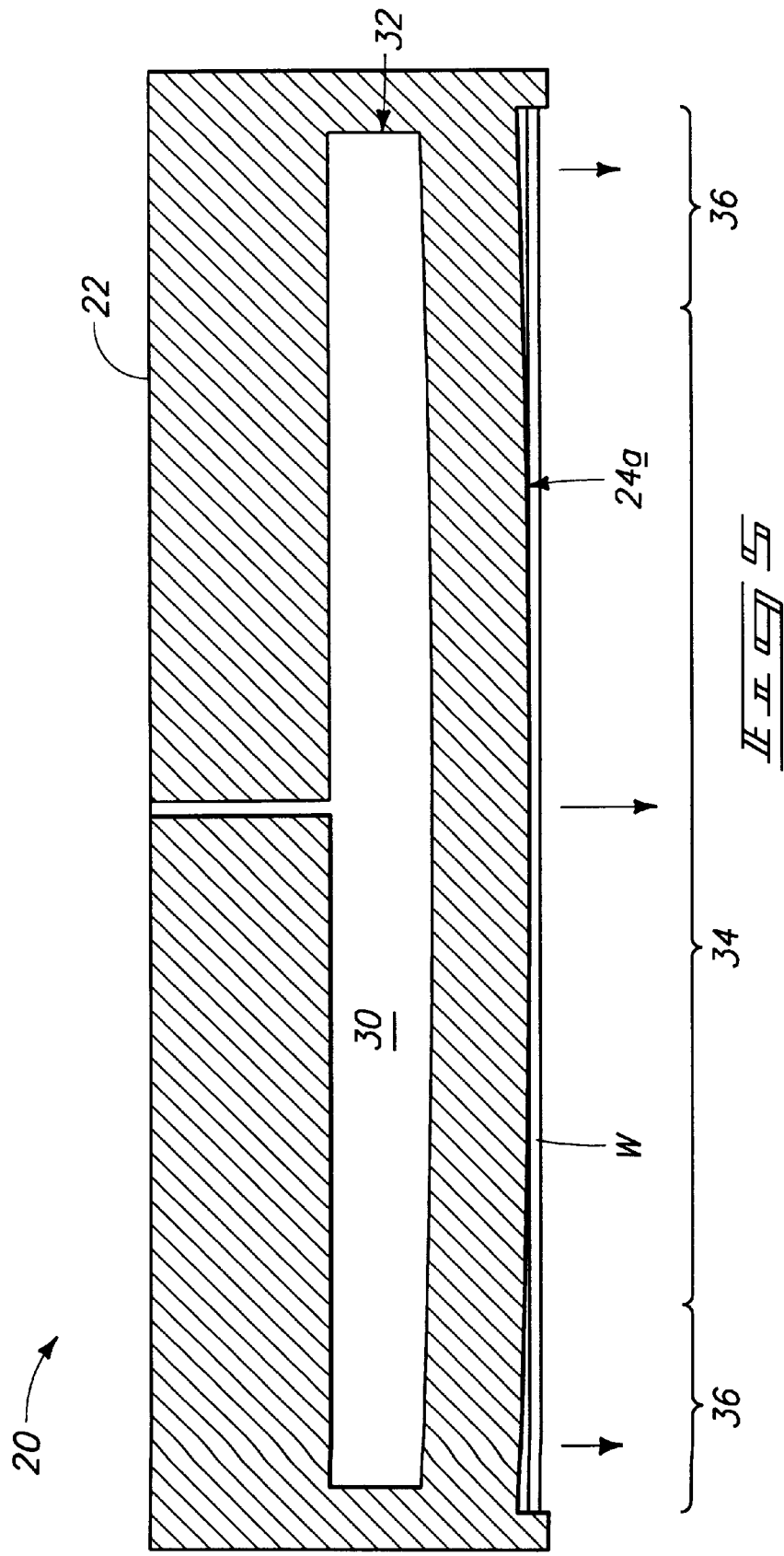
FIG. 5 is a view which is somewhat similar to the FIG. 4 view, but is one which shows a work piece mounted upon a chuck, in accordance with one embodiment of the invention.
Figure 6:
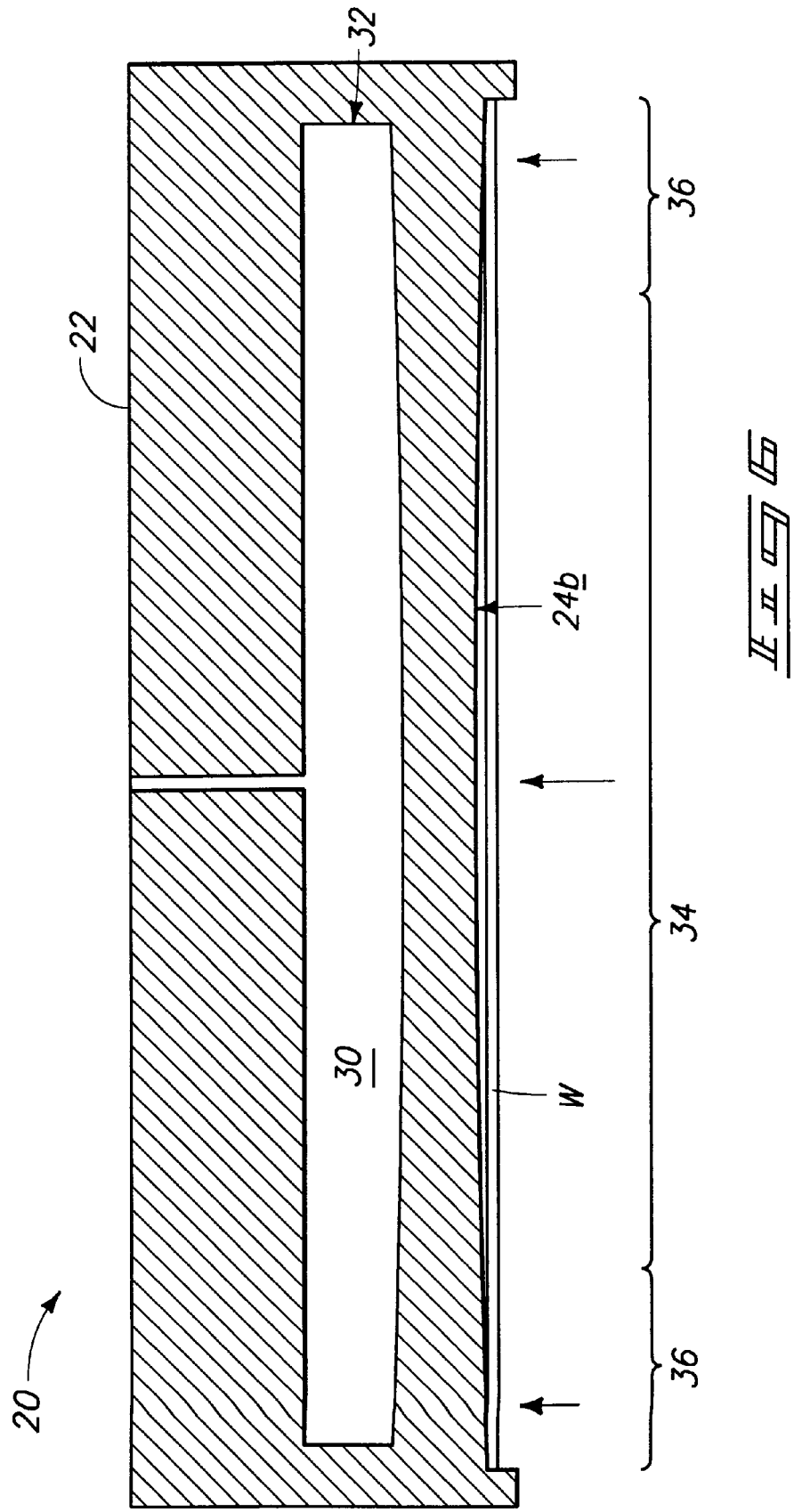
FIG. 6 is a view which is somewhat similar to the FIG. 5 view, but is one which shows a work piece mounted on a chuck in accordance with another embodiment of the invention.

In another embodiment, a yieldable engagement surface 24 is provided on body 22 and includes a central area 34 (FIG. 3) and a peripheral area 36 outward of central area 34. One of the central and peripheral areas 34, 36 is movable relative to the other of the areas to provide both outwardly and inwardly flexed surface configurations as shown in FIGS. 4–6. In the illustrated and preferred embodiment, central area 34 is movable relative to peripheral area 36 to achieve the various configurations. A pressure-variable region, such as region 30, can be provided proximate the one movable area, e.g. either or both of areas 34 or 36, and configured to develop desired pressures which are sufficient to move the area(s) into the inwardly and outwardly flexed surface configurations. In the illustrated example, the pressure-variable region is provided proximate both central and peripheral areas 34, 36.

Alternately considered, surface 24 constitutes, in one embodiment, a generally planar surface on body 22 which is movable into a non-planar, force-varying configuration in which more force can be exerted on outermost portions of a work piece during polishing than on innermost portions of a work piece. An exemplary non-planar, force-varying configuration is shown in FIG. 6 where surface 24b is seen to bow inwardly slightly away from the center of wafer W, and engages in a more direct manner, the peripheral portions of wafer W proximate peripheral areas 36. For illustrative purposes, wafer W is shown as being separated or spaced from surface 24b near the center of the wafer. Typically with work pieces which are flexible, as semiconductor wafers are, the wafer will tend to follow the contour of the engagement surface. Accordingly, the wafer would tend to be received more flushly against engagement surface 24b. In this example, the non-planar, force-varying configuration is generally concave toward the work piece.

Figure 7:
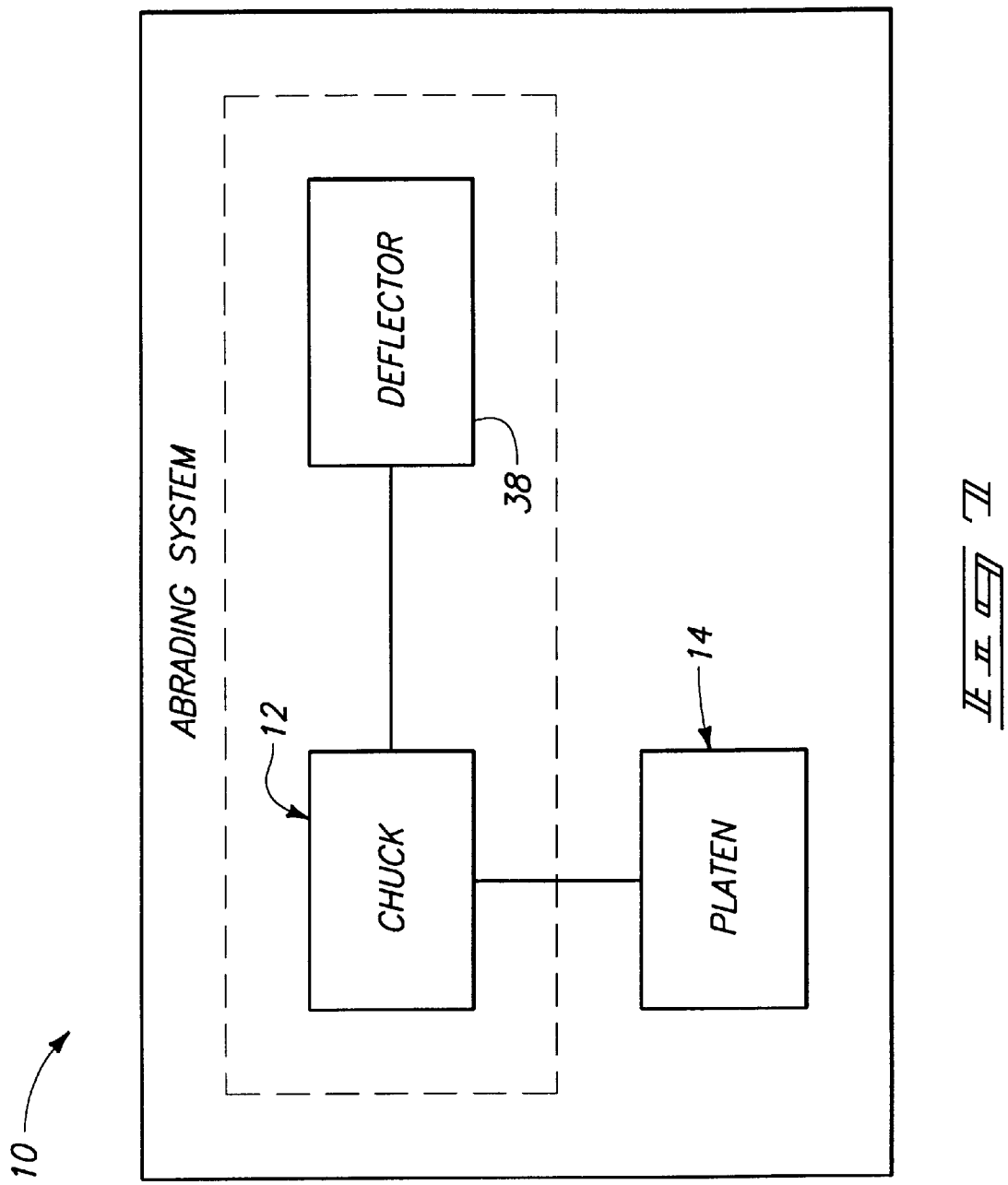
FIG. 7 is a high-level block diagram of an abrading system in accordance with one embodiment of the present invention.

In one embodiment, a deflector, such as deflector 38 (FIG. 7) is provided and is operably connected with surface 24 and configured to move the surface into the non-planar configuration. In one preferred embodiment, deflector 38 comprises a negative pressure assembly comprising a chamber, such as chamber 32, proximate surface 24 which is configured to develop negative pressures sufficient to move surface 24 into the non-planar, force-varying configuration which, in this example is generally outwardly concave.

In another preferred embodiment, deflector 38 comprises a pressure assembly comprising a chamber, such as chamber 32, proximate surface 24 which is configured to develop both negative and positive pressures which are sufficient to move surface 24 into different non-planar, force-varying configurations. In this example, the surface is movable into a second non-planar, force-varying configuration in which less force is exerted on outermost portions of the work piece during polishing than on innermost portions of the work piece. For example, FIG. 5 shows a configuration in which surface 24a is shown to engage the wafer near the centermost portions thereof, and not engage the wafer near outermost portions thereof. Such can result in less force being exerted on outermost portions of the wafer than on innermost portions thereof. Of course, with flexible wafers, the wafer would, as above, tend to follow the contour of the engagement surface.

In another preferred embodiment, surface 24 is movable into a plurality of configurations away from the generally planar configuration shown in solid lines in FIG. 4. These configurations can include incremental, non-planar configurations which are intermediate the generally planar (solid line) configuration shown at 24 in FIG. 4, and either or both of the non-planar configurations shown in dashed lines 24a, 24b, respectively. Accordingly, such incremental configurations can enable the force which is exerted on the outermost portions of the work piece during polishing to be incrementally varied in accordance with the plurality of surface configurations into which the surface can be moved during polishing. In a preferred embodiment, the different non-planar, force-varying configurations can be assumed during polishing of the work piece and subsequently varied if so desired. Such provides an added degree of flexibility during the polishing of a wafer. Accordingly, deflection and/or manipulation of the engagement surface can occur during the engagement and relative movement between the work piece and the engagement surface.

Alternately considered, at least a portion of surface 24 is movable in a direction away from wafer W (FIG. 6), wherein more force can be exerted by surface 24 on selected wafer portions, e.g. outermost wafer portions, during polishing than on other wafer portions. At least a portion of surface 24 can also be movable in a direction toward wafer W (FIG. 5), wherein more force can be exerted by the surface on selected wafer portions, e.g. innermost wafer portions, than other wafer portions. Surface 24 can also be movable into a plurality of positions wherein the exerted force can be varied. Such positions can occur incrementally between the neutral or undeflected position and either or both of the deflected positions, e.g. either toward or away from the wafer. One exemplary configuration is concave toward the wafer, and another exemplary configuration is concave away from the wafer.

In yet another embodiment, a semiconductor wafer polishing chuck includes a surface 24 on body 22 positioned to engage a semiconductor wafer which is received by body 22. At least a portion of surface 24 is deflectable, and in a preferred embodiment, a force-varying deflector 38 is provided on body 22 and is operable to move the deflectable surface portion into both concave and convex force-varying configurations. In one embodiment, the force-varying deflector comprises a region, such as region 30, proximate the surface portion which is selectively placeable into a variety of pressure configurations which act upon the surface portion sufficiently to move the surface portion into the concave and convex configurations. In one preferred embodiment, the force-varying deflector is operable to place the surface portion into a plurality of intermediate configurations between the concave and convex configurations. Other deflectors can be used such as mechanical actuators, pneumatically driven assemblies, piston assemblies, and the like.

Further considered, a semiconductor wafer polishing method includes initiating polishing of a semiconductor wafer surface with a polishing surface and after the initiating and while polishing, changing a polishing force between the wafer surface and the polishing surface and providing different polishing forces for different radial locations of the wafer.

In use, the various inventive abrading, grinding, and/or polishing systems provide for flexibility and/or uniformity before and during treatment of a work piece.

In one embodiment, a semiconductor wafer polishing method includes configuring a wafer polishing chuck, such as chuck 20, with a yieldable surface positioned to engage a semiconductor wafer during polishing. The yieldable surface is-deflected into a generally concave configuration toward the wafer (FIG. 6) which exerts more force on a periphery of the wafer during polishing than on a center of the wafer. In a preferred embodiment, the deflecting of the yieldable surface can take place before and during polishing of the wafer.

In another embodiment, a semiconductor wafer polishing method includes engaging selected surface areas of a semiconductor wafer with a first selected force. During polishing of the wafer, the first selected force is changed to a second different selected force which is sufficient to polish the wafer differently than would otherwise be possible if the first selected force were not changed. In one implementation, the selected wafer surface areas are engaged with a reconfigurable, force-changing engagement surface such as surface 24. In another implementation, the changing of the first selected force includes reconfiguring the engagement surface from a first configuration to one of either a second concave or second convex configuration. An exemplary first configuration comprises a generally planar or undeflected configuration.

In yet another embodiment, a polishing method includes providing a chuck having a body 22 dimensioned to hold a work piece which is to be polished. The polishing chuck includes a multi-positionable, force-bearing engagement surface 24 positioned on the body to engage at least a portion of a work piece held thereby. Surface 24 preferably has an undeflected position, and is bi-directionally deflectable away from the undeflected position. A work piece is subsequently engaged with the multi-positionable, force-bearing engagement surface 24. In one embodiment, surface 24 is deflected in a direction away from the work piece (FIG. 6) thereby engaging outer portions of the work piece with more force than inner portions of the work piece. In another embodiment, surface 24 is deflected in a direction away from the work piece during polishing thereof.

In a further embodiment, an abrading method includes providing a chuck having a body, such as body 22, dimensioned to hold a work piece which is to be abraded. The chuck includes a yieldable engagement surface on the body which is positioned to engage at least a portion of a work piece held thereby. The engagement surface includes a central area and a peripheral outward of the central area. One of the central and peripheral areas is movable relative to the other of the central and peripheral areas to provide both inwardly and outwardly flexed surface configurations. A work piece is subsequently engaged by the yieldable engagement surface and abraded. In one embodiment, the yieldable engagement surface is moved into the inwardly-flexed surface configuration while abrading the work piece. In another embodiment, the yieldable engagement surface is moved into the outwardly-flexed surface configuration while abrading the work piece.

In another embodiment, a semiconductor wafer polishing method includes providing a wafer polishing chuck having a body dimensioned to receive a generally planar semiconductor wafer which is to be polished. A surface is provided on the body and positioned to engage a semiconductor wafer received by the body. At least a portion of the surface is movable in a direction away from the wafer, wherein more force can be exerted by the surface on outermost wafer portions during polishing than on innermost wafer portions (FIG. 6). A semiconductor wafer is subsequently mounted on the wafer body and polished. In one embodiment, the method includes moving the surface portion away from the wafer. In another embodiment, the method includes moving the surface portion away from the wafer while polishing the wafer. In yet another embodiment, the surface portion is movable in a direction toward the wafer wherein more force can be exerted by the surface on innermost wafer portions (FIG. 5) during polishing than on outermost wafer portions. Further, the method can include moving the surface portion in at least one of the directions while polishing the wafer.

In other embodiments, methods of forming polishing chucks are provided. In one embodiment, a body, such as body 22, is provided to hold a work piece which is to be polished. A multi-positionable, force-bearing engagement surface, such as surface 24, is mounted on the body and positioned to engage at least a portion of a work piece held thereby. The surface preferably has an undeflected position and is bi-directionally deflectable away from the undeflected position as described above.

In yet another embodiment, a method of forming an abrading chuck includes providing a body dimensioned to hold a work piece which is to be abraded. A yieldable engagement surface, such as surface 24, is provided and is positionable on body 22 to engage at least a portion of a work piece held thereby. The engagement surface has a central area 34 and a peripheral area 36 outward of central area 34. One of the central and peripheral areas is preferably movable relative to the other of the central and peripheral areas to provide both inwardly and outwardly flexed surface configurations.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A semiconductor wafer polishing method comprising:
configuring a wafer polishing chuck with a yieldable surface positioned to engage a semiconductor wafer during polishing; and
deflecting the yieldable surface over a range no greater than one micron from an undeflected position into a generally concave configuration toward the wafer which exerts more force on a periphery of a semiconductor wafer during polishing than on a center of the wafer.

2. The semiconductor wafer polishing method of claim 1, wherein the deflecting of the yieldable surface comprises deflecting the surface during polishing of the wafer.

3. A semiconductor wafer polishing method comprising:
engaging a selected surface area of a semiconductor wafer with a polishing surface and exerting a first selected force; and
during polishing of the wafer, changing the first selected force with which the selected surface area of the wafer is engaged by moving at least a portion of the polishing surface over a range no greater than one micron from an undeflected position to a second different selected force sufficient to polish the wafer differently than would otherwise occur if the first selected force were not changed.

4. The semiconductor wafer polishing method of claim 3, wherein the selected surface area is less than the entire surface area on one side of the wafer.

5. The semiconductor wafer polishing method of claim 3, wherein the engaging of the selected surface area comprises engaging the selected surface areas with a reconfigurable, force-changing engagement surface.

6. The semiconductor wafer polishing method of claim 3, wherein:
the engaging of the selected surface area comprises engaging the selected surface area with a reconfigurable, force-changing engagement surface; and
the changing of the first selected force comprises reconfiguring the engagement surface from a first configuration to one of either a second concave or second convex configuration.

7. The semiconductor wafer polishing method of claim 6, wherein the first configuration comprises a generally planar configuration.

8. A semiconductor wafer polishing method comprising:
initiating polishing of a semiconductor wafer surface with a polishing surface; and
after the initiating and while polishing, changing a polishing force between the wafer surface and the polishing surface and providing different polishing forces for different radial locations of the wafer by moving at least a portion of the polishing surface over a range no greater than one micron from an undeflected position.

9. A polishing method comprising:
providing a polishing chuck having:
a body dimensioned to hold a work piece which is to be polished; and
a multi-positionable, force-bearing engagement surface positioned on the body to engage at least a portion of a work piece held thereby, the surface having an undeflected position and being bi-directionally deflectable away from the undeflected position over a range no greater than one micron from the undeflected position; and
engaging a work piece with the multi-positionable, force-bearing engagement surface and providing relative movement between the work piece and the surface.

10. The polishing method of claim 9 further comprising deflecting the surface in a direction away from the work piece and engaging outer portions of the work piece with more force than inner portions of the work piece.

11. The polishing method of claim 10, wherein the deflecting occurs during the engaging while providing the relative movement.

12. The polishing method of claim 9 further comprising deflecting the surface in a direction away from the work piece during polishing, and engaging outer portions of the work piece with more force than inner portions of the work piece.

13. A method of forming a polishing chuck comprising:
providing a body dimensioned to hold a work piece which is to be polished; and
mounting on the body, a multi-positionable, force-bearing engagement surface positioned to engage at least a portion of a work piece held thereby, the surface having an undeflected position and being bi-directionally deflectable away from the undeflected position over a range no greater than one micron from the undeflected position.

14. The method of claim 13 further comprising providing a region proximate the engagement surface, the region being selectively placeable into a variety of pressure configurations which act upon the engagement surface sufficiently to deflect the engagement surface in one direction away from the undeflected position.

15. The method of claim 13 further comprising providing a pressure chamber proximate the engagement surface and configured to develop regions of positive and negative pressure sufficient to deflect the engagement surface.

16. An abrading method comprising:
providing a chuck having:
a body dimensioned to hold a work piece which is to be abraded; and
a yieldable engagement surface on the body positioned to engage at least a portion of a work piece held thereby, the engagement surface having a central area and a peripheral area outward of the central area, one of the central and peripheral areas being movable relative to the other of the central and peripheral areas over a range no greater than one micron from an undeflected position to provide both inwardly and outwardly flexed surface configurations; and
engaging a work piece with the yieldable engagement surface and providing relative movement between the work piece and the engagement surface.

17. The method of claim 16 further comprising moving the yieldable engagement surface into the inwardly-flexed surface configuration while abrading the work piece.

18. The method of claim 16 further comprising moving the yieldable engagement surface into the outwardly-flexed surface configuration while abrading the work piece.

19. A method of forming an abrading chuck comprising:

providing a body dimensioned to hold a work piece which is to be abraded; and providing a yieldable engagement surface positionable on the body to engage at least a portion of a work piece held thereby, the engagement surface having a central area and a peripheral area outward of the central area, one of the central and peripheral areas being movable relative to the other of the central and peripheral areas over a range no greater than one micron from an undeflected position to provide both inwardly and outwardly flexed surface configurations.

20. The method of claim 19 further comprising providing a pressure-variable region proximate the one movable area and configured to develop pressures sufficient to move the one area into the inwardly and outwardly flexed surface configurations.

21. The method of claim 19 further comprising providing a pressure-variable region proximate the central and peripheral areas and configured to develop pressures sufficient to move the surface into the inwardly and outwardly flexed surface configurations.

22. A semiconductor wafer polishing method comprising:

providing a wafer polishing chuck having:

a body dimensioned to receive a generally planar semiconductor wafer which is to be polished; and a surface on the body positioned to engage a semiconductor wafer received by the body, at least a portion of the surface being movable in a direction away from the wafer over a range no greater than one micron from an undeflected position, wherein more force can be exerted by the surface on outermost wafer portions during polishing than on innermost wafer portions; and mounting a semiconductor wafer on the body.

23. The method of claim 22 further comprising moving said surface portion away from said wafer.

24. The method of claim 22 further comprising moving said surface portion away from said wafer while polishing the wafer.

25. The method of claim 22, wherein the surface portion is movable in a direction toward the wafer, wherein more force can be exerted by the surface on innermost wafer portions during polishing than on outermost wafer portions, and further comprising moving said surface portion in at least one of said directions while polishing the wafer.

* * * * *